United States Patent [19]
McGreivy et al.

[11] 4,103,297
[45] Jul. 25, 1978

[54] LIGHT-INSENSITIVE MATRIX ADDRESSED LIQUID CRYSTAL DISPLAY SYSTEM

[75] Inventors: Denis J. McGreivy, Laguna Beach; Henry T. Peterson, Irvine; Alex M. Leupp, Costa Mesa, all of Calif.

[73] Assignee: Hughes Aircraft Company, Culver City, Calif.

[21] Appl. No.: 752,037

[22] Filed: Dec. 20, 1976

[51] Int. Cl.² ............................................. G06F 3/14
[52] U.S. Cl. ........................ 340/324 M; 350/333; 357/41; 357/52
[58] Field of Search ............ 357/41, 52; 350/160 LC; 340/324 M

[56] References Cited
U.S. PATENT DOCUMENTS

| | | | |
|---|---|---|---|
| 3,824,003 | 7/1974 | Koda et al. | 350/160 LC |
| 3,862,360 | 1/1975 | Dill et al. | 350/160 LC |
| 3,882,531 | 5/1975 | Michon et al. | 357/41 |
| 3,931,633 | 1/1976 | Shannon et al. | 357/41 |
| 4,011,581 | 3/1977 | Kubo et al. | 357/41 |
| 4,011,653 | 3/1977 | Kato et al. | 357/41 |
| 4,024,626 | 5/1977 | Leupp et al. | 357/41 |

*Primary Examiner*—Marshall M. Curtis
*Attorney, Agent, or Firm*—W. H. MacAllister; Joseph E. Szabo

[57] ABSTRACT

A liquid crystal display addressable by a backplate semiconductor MOSFET switching matrix is made light insensitive by ion implanting the backplate around the MOSFETs to prevent the formation of photon generated inversion layers and by extending the reflective back electrodes over the MOSFETs to prevent incident light from striking those areas of the backplate which are not protected by ion implantation.

8 Claims, 14 Drawing Figures

LIGHT-INSENSITIVE MATRIX ADDRESSED LIQUID CRYSTAL DISPLAY SYSTEM

BACKGROUND OF THE INVENTION

This invention relates to liquid crystal display systems and particularly to such systems which comprise an array of individually addressable electrodes formed on a semiconductor backplate.

One type of liquid crystal display systems comprises a plurality of individually addressable cells arranged in a matrix array, with each of the elemental cells of the array operating as a reflective light valve. In the absence of applied potential, the liquid crystal material is clear and the cell appears dark to an observer. When electric potential above a threshold level is applied across the liquid crystal material, it scatters the light, much like a piece of frosted glass, and the cell appears white to the observer. The percentage of incident light which is scattered towards the viewing area is proportional to the magnitude of the potential applied to the liquid crystal cell, and consequently gray level display presentations may be produced.

In high resolution display systems a composite presentation is built up from thousands of individually controllable elemental liquid crystal cells, each of which must be updated (the potential across the cell reprogrammed) at a rate sufficiently high to prevent observable flicker in the presentation. This may be accomplished by sandwiching a thin layer of liquid crystal material between a glass plate having a transparent electrode, and a backplate having a matrix array of reflective electrodes formed on a semiconductor wafer. The backplate also contains the individual addressing circuitry (field effect transistor) and electrical storage circuitry (capacitor) disposed contiguous to the reflective liquid crystal contact electrode for each cell, with the reflective electrode forming one element or plate of the capacitor. Each field effect transistor is utilized to address an associated element of the matrix array, and the associated storage capacitor maintains the applied potential across the liquid crystal cell until the information is updated (every 33 milliseconds in a typical display). An example of this type of construction is disclosed and claimed in U.S. Pat. No. 3,862,360 issued to Dill et al, and assigned to the assignee of the present invention.

Liquid crystal display systems of the type just described are reflective displays and therefore require incident light for their operation. Unfortunately, the field effect transistors (FET's) used to control the storage capacitors in the backplate are extremely sensitive even to very low levels of incident light. As a result the ability of the storage capacitors to maintain the applied potential across the liquid crystal cells between pulses is seriously affected. The shielding effect of the reflective electrodes which lie in a plane between the front of the display and the field effect transistors is insufficient to prevent incident light from discharging the potential on the storage capacitors. This is so because there must be a gap between respective columns and rows of electrodes.

SUMMARY OF THE INVENTION

It is therefore an object of the present invention to provide a matrix-addressed liquid crystal display system whose switching circuitry is substantially impervious to incident light.

As taught in the above-identified Dill et al patent, one element, or plate, of each storage capacitor may be formed in the semiconductor backplate by ion implantation. As taught by Dill et al, the reflective electrodes form the top plates of the storage capacitors and a plurality of highly doped areas in the substrate, each disposed under a respective one of the reflective electrodes, serves as the bottom plate of each capacitor. It has been discovered by the present inventors that displays of this type can be made substantially impervious to light by extending the doped layer in the surface of the semiconductor wafer so as to cover all but the areas where the switching transistors are to be formed, and by extending each reflective electrode entirely over a respective one of the openings left in the doped layer for the switching transistors. As a result, the doped layer extends wherever there is a gap between adjacent electrodes and the electrodes cover whatever gaps there are left in the doped layer. This drastically cuts down on the light sensitivity of the display because that sensitivity is due largely to a space charge region which tends to be created under each electrode in the semiconductor wafer upon the application of a DC bias to the electrode. Incident light, striking the semiconductor wafer between adjacent reflective electrodes then causes photogeneration of electron-hole pairs in the space charge region which accelerates the formation of an inversion layer which in turn interferes with the proper operation of the storage capacitors.

The present invention prevents the formation of the space charge region under the back electrodes by providing a heavily doped layer in the semiconductor which extends wherever there is a gap between adjacent electrodes and the extension of the reflective electrodes over the gaps in the doped layer prevents light from striking those portions of the semiconductor wafer not protected by the heavily doped layer.

BRIEF DESCRIPTION OF THE DRAWINGS

The novel features of this invention as well as the invention itself will be best understood from the accompanying description taken in conjunction with the accompanying drawings wherein like characters refer to like parts and in which.

DESCRIPTION OF THE PREFERRED EMBODIMENT

Figure 1:
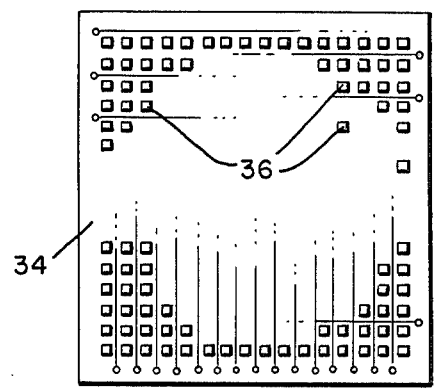
FIG. 1 is a plan view of the front surface of the backplate of a display panel of the type to which the present invention pertains.

Before describing the improvement effected by the present invention, the structure and operation of a display system comprising an array of elemental cells such as those disclosed more fully in the above-identified Dill et al Patent 3,862,360, and which is incorporated herein by this reference, will be described with reference to FIGS. 1 and 2. As there shown, a liquid crystal display panel 26 is formed by sandwiching a thin layer of liquid crystal material 28 between a glass plate 30 which has a transparent electrode 32 covering one surface and a backplate 34, the latter comprised of a semiconducting substrate, typically silicon, having a matrix array of reflective electrodes 36 formed thereon. The individual addressing circuits are adjacent to reflective electrodes which also serve as the top plates of the storage capacitors. The transparent electrode 32 acts as a common electrode for all of the individual cells which are arranged in a plurality of rows and columns. The 16 × 16 matrix of elemental cells illustrated in FIG. 1 is shown at approximately 20 times their actual size for clarity of illustration. In an actual panel many more elements, on the order of 1000 × 1000 or more, would be used. Associated with each cell in addition to the liquid crystal material 28 sandwiched between electrodes 32 and 36 is a field effect transistor (FET) 22 and a capacitor 24.

Capacitor 24 and FET 22 form an elemental sample and hold circuit whose purpose is to "stretch" addressing pulses, typically 30 microseconds in duration, to pulses of typically 30 milliseconds duration needed to effectively maintain the potential across the liquid crystal material between addressing pulses. Capacitor 24 comprises metal electrode 36 separated from an N+ doped region 15 (normally grounded and preferably ion implanted) in the silicon substrate 34 by a dielectric layer 68. Associated with and forming the P channel FET shown in FIG. 2 are gate 62, drain bus 64, source contact 60 and drain and source regions 39 and 41. The latter are formed as P+ regions in the N-type silicon substrate 34. Through the source contact 60 which is an integral extension thereof, the reflective electrode 36 is in contact with the source region 41. All gates in a given row of cells are connected to a respective gate bus and the drain regions of all FET's in a given column of cells are connected to a respective drain bus 64.

Figure 2:
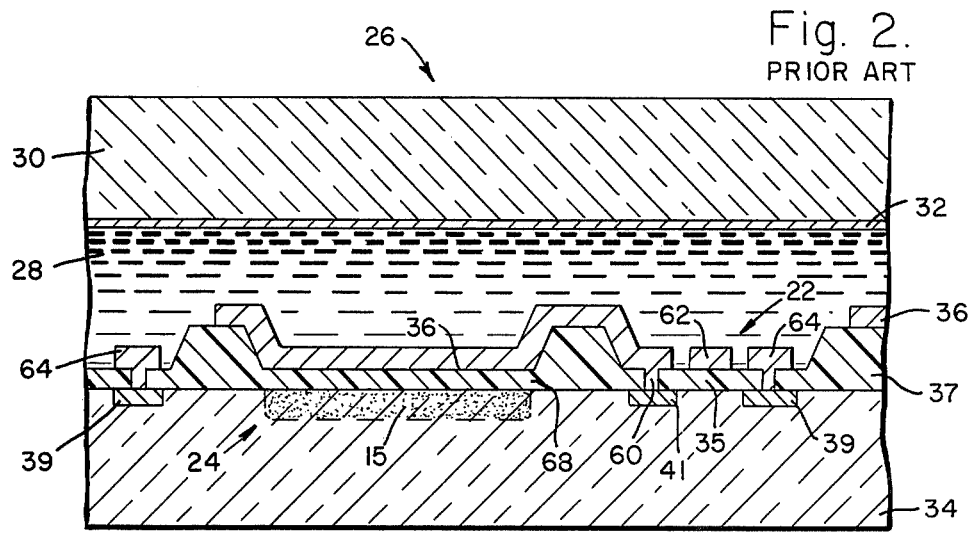
FIG. 2 is a cross section through a liquid crystal display panel as disclosed in the Dill et al patent over which the present invention is an improvement.
Figure 3:
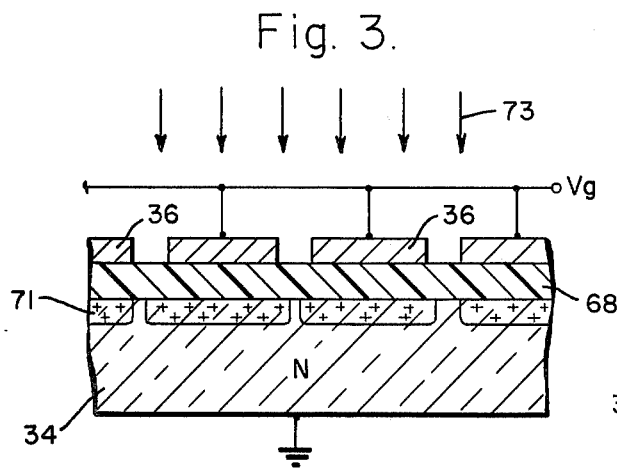
FIG. 3 is a simplified schematic representation of the cross section illustrated in FIG. 2 to show the manner in which an inversion layer is created under the back electrodes illustrated in FIGS. 1 and 2 under the influence of an operating voltage being applied to those electrodes and in the presence of incident light.

The effect of incident light on the display illustrated in FIG. 2 is shown by FIG. 3. For sake of simplicity, the ion implanted regions 15 which serve as the bottom plates of the capacitors 24 have been omitted and the reflective back electrodes 36 are shown as flat plates separated from the surface of the semiconductor wafer 34 by a layer of oxide 68 of uniform thickness. Also omitted are the switching FET's 22 and an operating voltage $V_g$ is shown applied directly to the electrodes 36 when in fact that voltage is applied to those electrodes through the FET's 22. Application of the voltage $V_g$ to the electrodes 36 creates a space charge region 71 under each electrode. Also, depletion regions are created around source 41 due to voltage applied thereto from plate 36. Those depletion regions merge to create a depletion layer.

When the display thus energized is exposed to incident light indicated by the arrow 73, electron-hole pairs are generated in the space charge region. This results from the incident light 73 passing through the spaces between the adjacent electrodes 36 and striking the space charge regions 71. The electrons then flow into the substrate while the holes flow toward the electrodes 36 forming an inversion layer in the semiconductor near the dielectric 68. The formation of this inversion layer, which is contiguous to the source diffusion 41, reduces the net charge stored on the capacitor 24 by discharging it gradually through a path which leads from the source diffusion 41 through the inversion layer to the substrate. Conduction between the inversion layer and the substrate occurs by the photo-generation of electron-hole pairs as described above.

Figure 4:
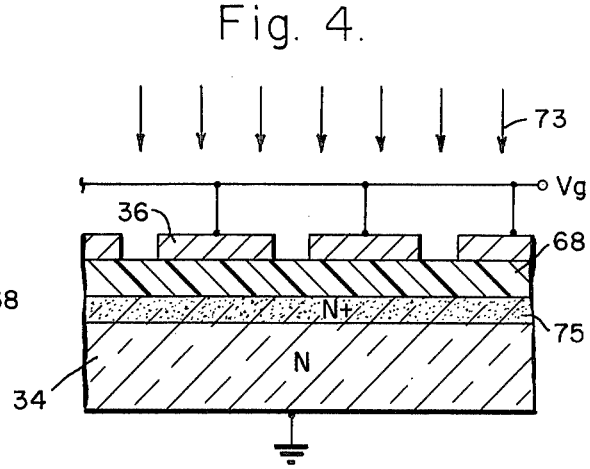
FIG. 4 depicts the same set of circumstances as those illustrated in FIG. 3, but with a doped layer extending under the back electrodes in accordance with a feature of the present invention.

When a highly doped layer 75 is added immediately under the oxide layer 68 along the surface of the semiconductor substrate 34 as shown in FIG. 4, the creation of space charge regions is prevented and consequently when the display is exposed to incident light inversion layers cannot form. It should be noted that, even though isolated ion implanted doped regions 15 are provided in the prior art display illustrated in FIG. 2, their extent is not sufficient to prevent the formation of space charge regions in the semiconductor substrate. Moreover, as will be disclosed hereinafter, the electrodes 36 are so configured in accordance with the present invention that they overlap whatever openings there are provided in the doped layer 75 for the formation of the FET devices 22. It is the combination of the doped layer 75 with the coverage provided by the electrodes 36 which provides protection form incident light in accordance with the present invention.

Figure 11:
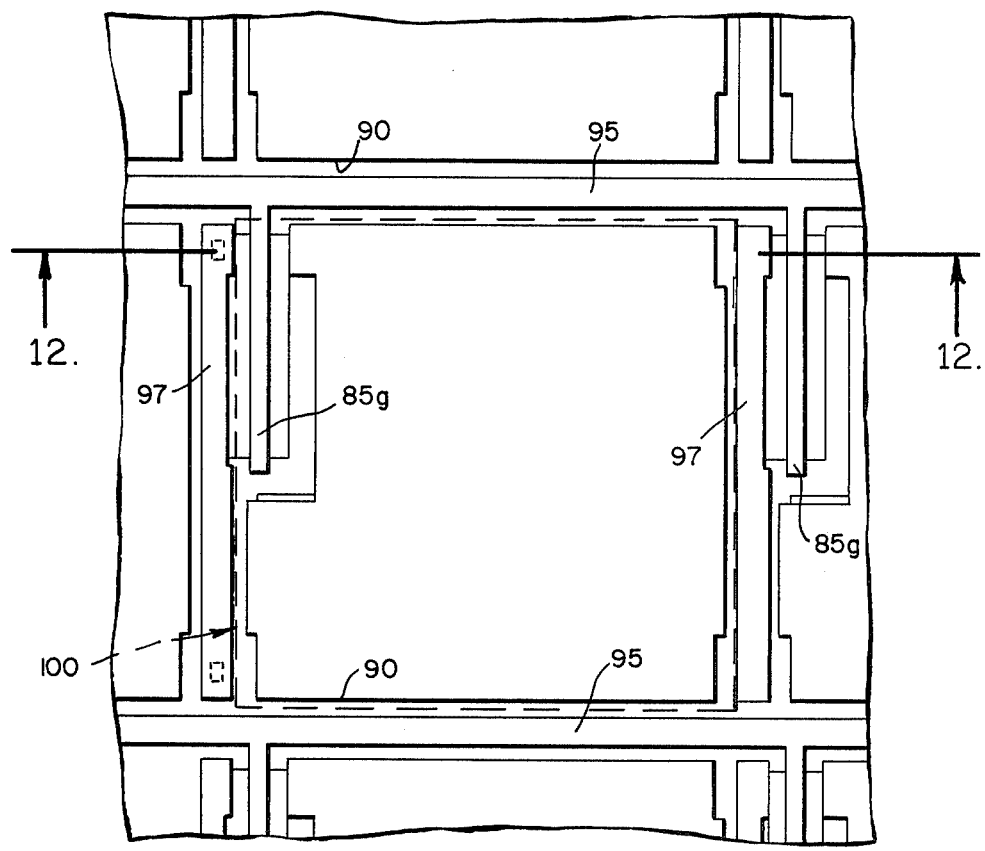
FIGS. 11 and 12 illustrate the device after its next step of fabrication, during which metal conductors and gate electrodes are formed over the oxide layer covering the substrate surface.
Figure 12:
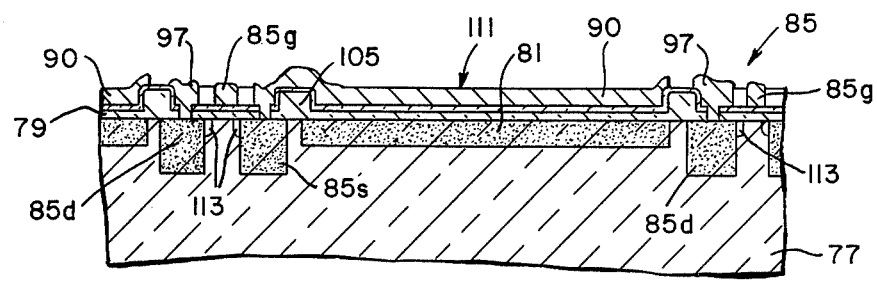
Figure 13:
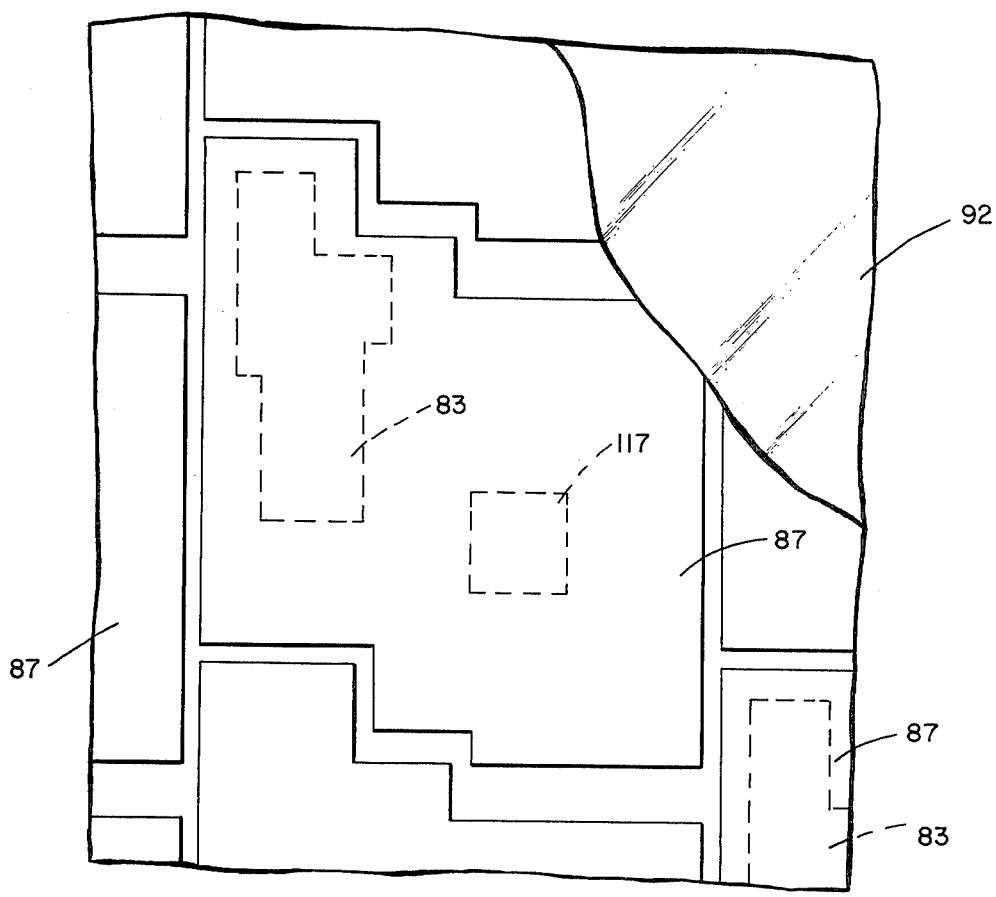
FIGS. 13 and 14 show in plan and cross-sectional views the essentially completed device of the present invention, after several additional fabrication steps, during which an additional insulating layer has been deposited over the previously formed conductors and electrodes, and an additional set of reflective electrodes have been formed so as to extend over and shield the switching FET devices previously formed in the semiconducting backplate.
Figure 14:
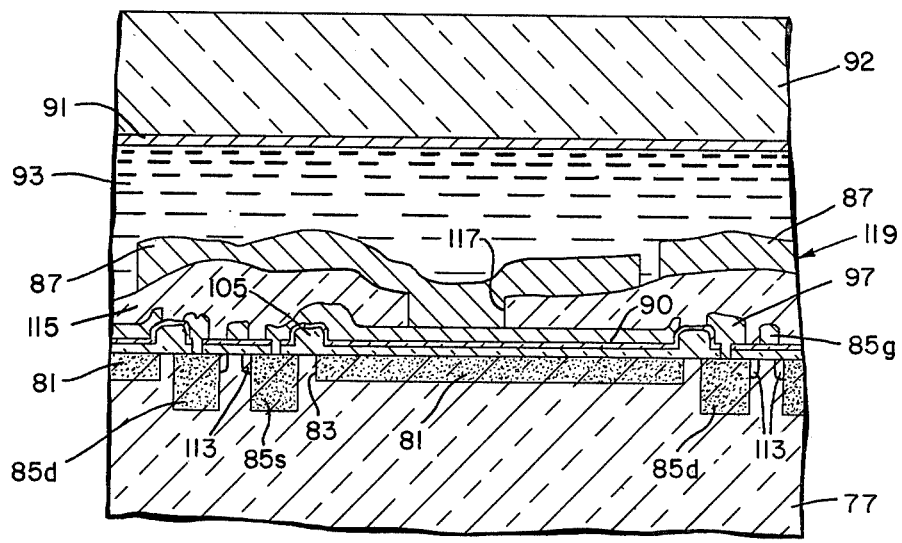

Referring next to FIGS. 7 through 14, a liquid crystal display panel incorporating features of the present invention will be described. Similar in configuration to that illustrated in FIG. 2, the display of the present invention includes a semiconductor backplate 77 having a major surface 79 in which a heavily doped layer 81 is created. Any array of openings 83 arranged in a plurality of columns and rows is left in the doped layer 81 (FIG. 7) and a switching device 85, shown as an FET, is formed in the semiconductor backplate 77 within each opening. A coplanar array of closely spaced reflective back electrodes 87 is disposed above the backplate surface 79, with each back electrode 87 extending entirely over a respective one of the openings 83 (FIGS. 13 and 14). Means 89 are provided for electrically connecting each of the FET's 85 to the back electrode 87 extending over it. In the preferred embodiment disclosed, the connecting means 89 comprises an intermediate electrode 90 which is connected to the FET 85 and particularly to its source 85s (FIG. 14). The intermediate electrode 90 extends parallel to the semiconductor backplate surface 79 to form a capacitor with the doped layer 81.

Spaced from the coplanar array of back electrodes 87 is a transparent front electrode 91 supported on a glass plate 92. Liquid crystal material 93 is confined by appropriate sealing means (not shown) between the front and back electrodes 91 and 87. Finally, means are provided for applying an actuating voltage between selected ones of the back electrodes 87 and the front electrode 91 through the switching devices 85 in order to effect a pictorial display. In the preferred embodiment of the invention each of these switching devices is a metal oxide semiconductor field effect transistor (MOSFET) having a source 85s, a drain 85d, formed as doped regions in the substrate 77 and a metal or silicon gate 85g extending between them. The means for applying an actuating voltage to the device includes a plurality of equidistant, parallel, gate buses 95, each gate bus being connected to all of the gates 85g of a different row of switching transistors 85. Also forming part of the means for applying an actuating voltage are a plurality of equidistant, parallel supply buses 97, each connected to all of the drains 85d of a different column of switching transistors 85.

As best seen in FIG. 11, the supply and gate buses 97 and 95 define a plurality of similarly shaped (square in the illustrated embodiment) areas 100. Each of the openings 83 in the doped layer 81 (FIG. 7) is located at the corner of a different one of the square areas 100 and each of the intermediate electrodes 90 (FIG. 11) is located entirely within the confines of a corresponding one of those areas.

Figure 7:
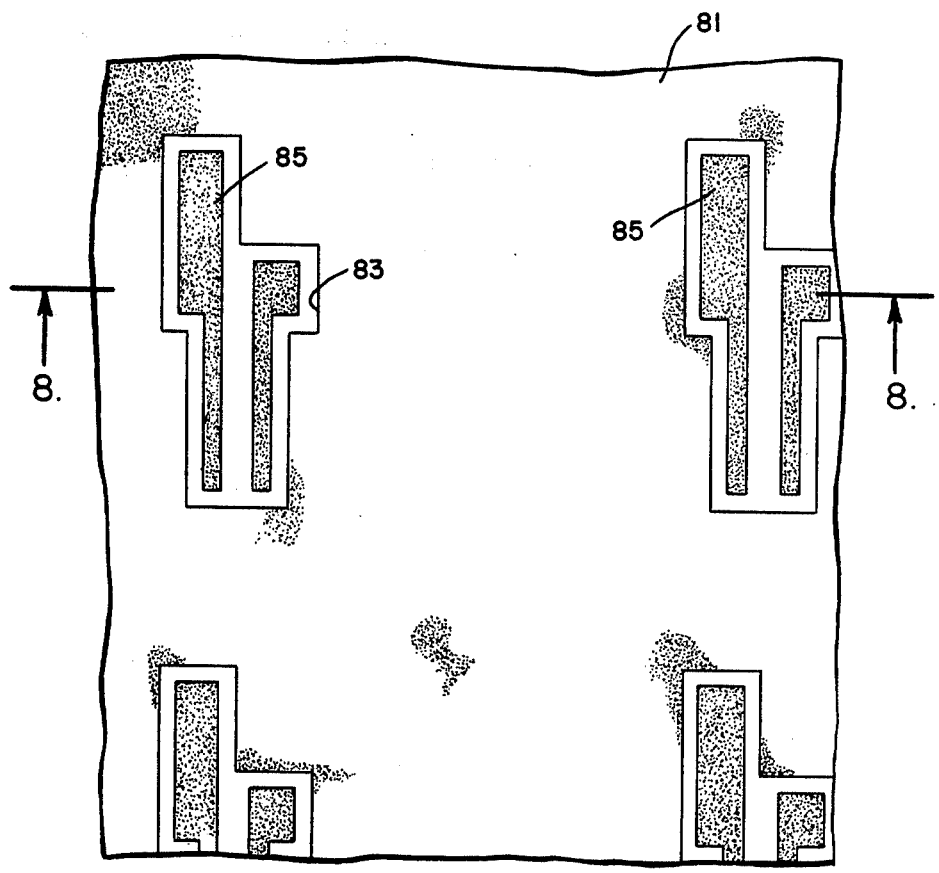
FIGS. 7 and 8 illustrate the next step in the manufacturing process, during which a heavily doped layer is implanted in the surface of the semiconductor backplate.

In keeping with the present invention by sufficiently offsetting them laterally relative to the areas 100, the reflective back electrodes 87 are made to extend entirely over the openings 83 (compare FIGS. 7 and 13). As a result, any part of the substrate 77 which is exposed to the incident light which might reach it between adjacent ones of the reflective electrodes 87 will strike the heavily doped layer 81 where it cannot create an inversion layer.

It is worth noting that, even though the array of reflective back electrodes 87 and their associated intermediate electrodes 90 are also offset relative to one another, they cannot provide 100% coverage of the surface 79 against incident light. This is so because both arrays of electrodes 87 and 90 are arranged in columns and rows, with corresponding spaces between them. It is only because the doped layer 81 is continuous and has only openings 83 that it, in combination with the offset electrodes 87, can provide the complete coverage which is desired for maximum immunity from incident light.

Figure 5:
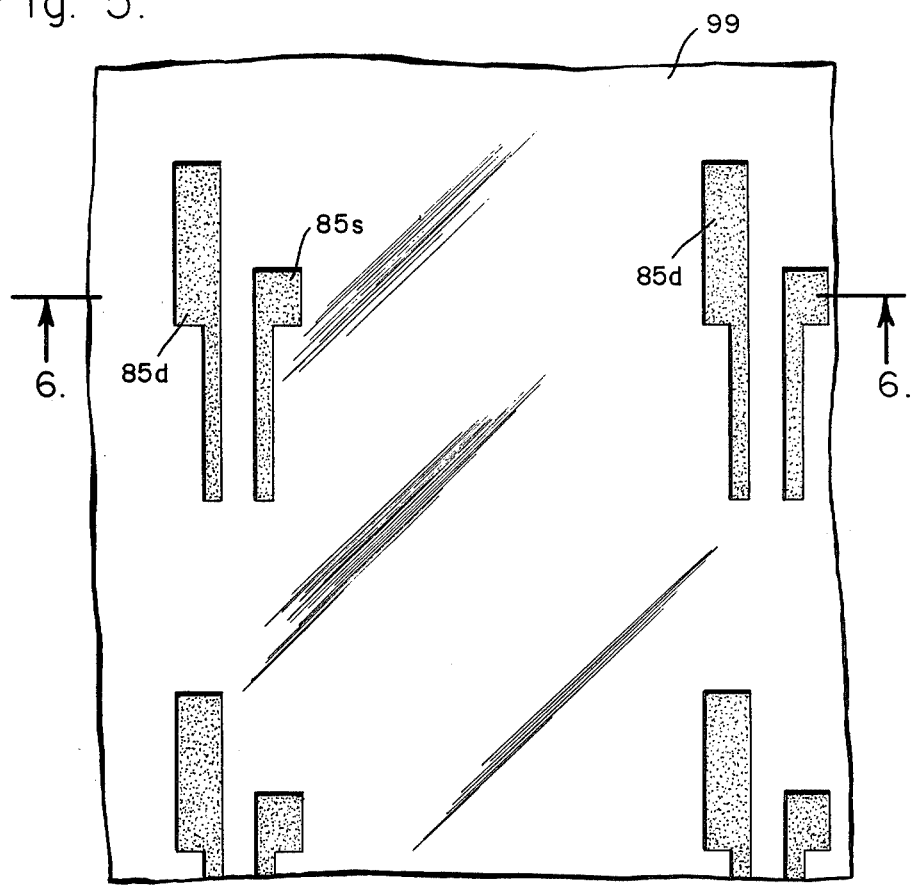
FIGS. 5 and 6 are the first of a series of plan views and cross sections of the preferred embodiment of the present invention during successive stages of its fabrication, illustrating a semiconductor backplate in which diffusions have just been formed to create the sources and drains of switching FET devices.
Figure 6:
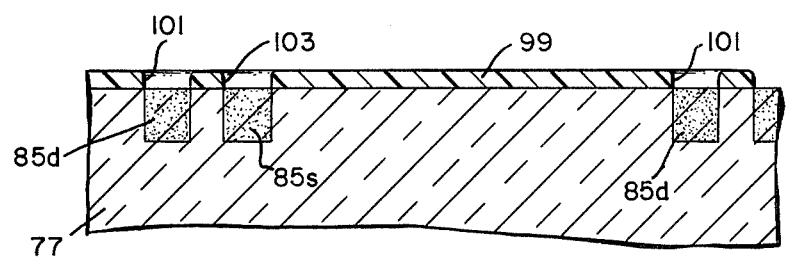
Figure 8:
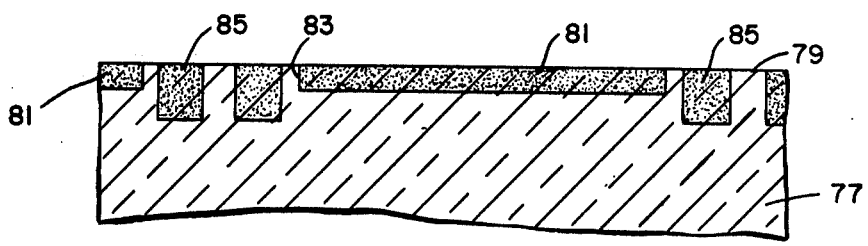

The principal steps of a method which may be used to fabricate a liquid crystal display panel incorporating features of the present invention will next be described with reference to FIGS. 5 through 14. The first step, shown in FIGS. 5 and 6, is related to the formation of the MOSFETs 85 and involves the growing and etching of an oxide layer 99 having openings 101 and 103 for defining the extent of the drain and source diffusions 85d and 85s, respectively. With the semiconductor substrate 77 being N-doped as described for example in the above-referenced Dill et al patent (with a 3 ohm-centimeter substrate being typical), the source and drain diffusions 85s and 85d will comprise P regions formed by standard diffusion techniques. The oxide layer 99 is then removed (FIGS. 7 and 8) and the semiconductor substrate surface 79 is again masked with photoresist so as to expose all but the areas in which the MOSFETs 85 are to be formed. The exposed portions of the substrate surface 79 are then ion implanted, thereby creating a heavily doped layer 81 with openings 83 as shown in FIGS. 7 and 8.

An implantation dose of $2 \times 10^{13}$ atoms/cm$^2$ at 60 KEV has been found suitable for achieving the desired doping concentration.

Figure 9:
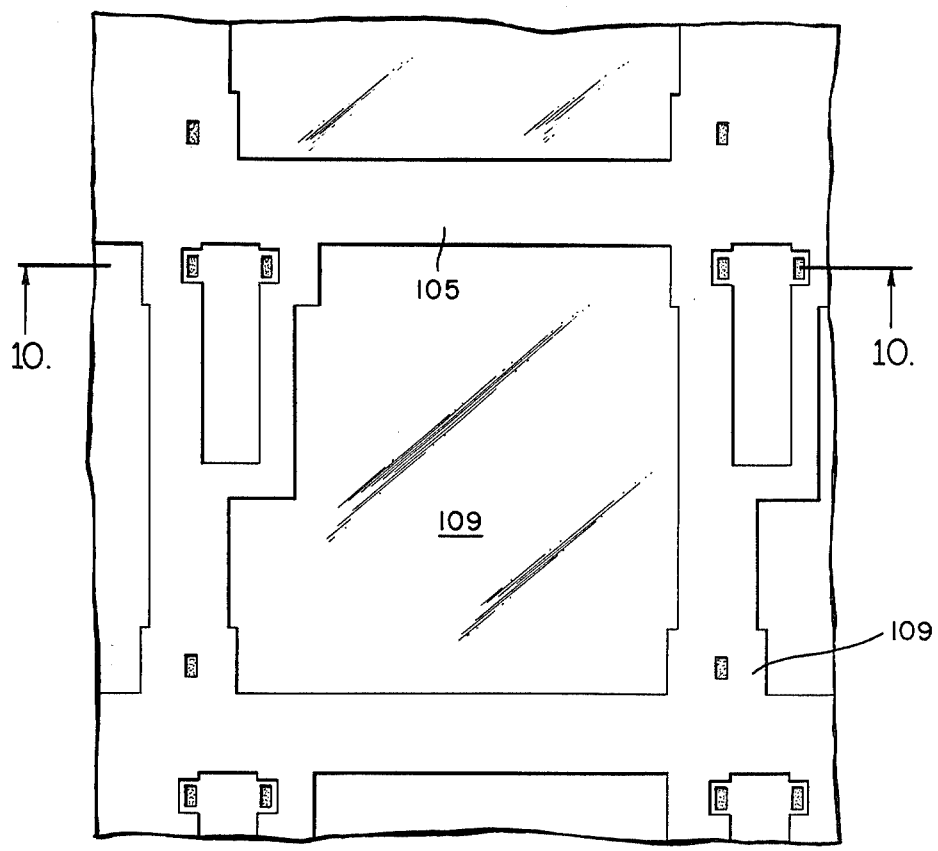
FIGS. 9 and 10 are plan and cross-sectional views of the device after its next step of fabrication, during which the backplate surface is covered by an insulating layer.
Figure 10:
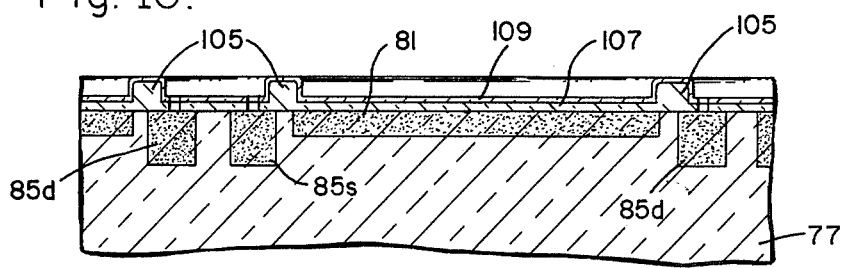

After removing the ion implantation mask, the thick oxide layer 105 is grown on the substrate surface (FIGS. 9 and 10). The thick oxide layer 105 is then masked and etched down to the silicon surface to define the areas in which a thin insulating layer is to be grown. This thin insulating layer is preferably formed by first growing a thin oxide layer 107 on the substrate surface and then depositing a second, thin layer of silicon nitride 109 on top of the thin oxide layer 107. Typical thicknesses for the layer 107 and 109 and 700 angstroms and 300 angstroms, respectively. The reason for forming a double layer rather than a single thin layer of oxide is that this tends to reduce the possibility of a mask defect causing a pin hole extending all the way through the thin oxide layer. As best seen by comparing FIGS. 9 and 10 with FIG. 11, the thin insulator layer 107, 109 is provided in those areas which are to receive either an intermediate electrode 90 or the gate of a MOSFET 85. The thick oxide regions 105 are provided to receive the bus lines 95 and 97 and are made relatively thick in order to minimize the risk of voltage inversion created in the substrate by the potential being maintained on those lines and to minimize the bus line capacitance.

The next step in the process is again to mask the assembly shown, leaving only those areas in the nitride layer 109 open through which contact is to be made with the underlying diffusions 85d and 85s. By means of an appropriate etchant an opening is then formed through the nitride layer 109 down to the underlying thin oxide layer 107. By means of a second selective etchant which attacks the underlying thin oxide layer 107, but not the silicon nitride layer 109, the openings are then extended all the way down to the substrate surface, thereby exposing the underlying diffusions 85d and 85s, as shown in FIGS. 9 and 10.

Next to be formed are the conductive buses 95 and 97 and the intermediate electrodes 90. These elements are preferably made of a heavily boron-doped polysilicon which is deposited in a layer 111, typically 5,000 angstroms thick, on top of the structure illustrated in FIGS. 9 and 10. A suitable resistivity value for the polycrystalline silicon layer is 50 ohms per square. Next the polycrystalline silicon layer 111 is masked in order to define the boundaries of the buses 95 and 97 and of the intermediate electrodes 90. The regions left exposed by the mask are then etched, leaving the outlines of the polycrystalline layer 111 as shown in FIGS. 11 and 12. Using the etched polysilicon layer 111 as a mask, the structure as illustrated in FIGS. 11 and 12 is subjected to a further ion implantation step in order to create the small extensions 113 from the source and drain diffusions 85s and 85d. By means of the extensions 113 the source and drain regions 85s and 85d are brought into alignment with the gate electrode 85g for optimum device operation. An appropriate implantation dose for creating the extensions 113 has been found to be in the region of $2 \times 10^{14}$ atoms/cm$^2$ at 80 KEV.

Turning next to FIGS. 13 and 14, another silicon dioxide layer 115, on the order of 10,000 angstroms thick, is deposited on top of the polycrystalline silicon layer 111. Openings 117 are then etched in the oxide layer 115, after which a metal layer 119 is deposited on top of the oxide layer 115, and extending through the openings 117 therein into contact with the intermediate electrode 90. Chromium has been found suitable for the metal layer 119, which is next masked by a pattern which is laid out to protect against a selective etchant, the portions of the layer which are to serve as the reflective electrodes 87.

The above steps essentially complete the construction of the elements which are located on the substrate 34. What remains is to place a film of liquid crystal material 93 on top of the assembly created by the preceding steps and a glass or other transparent plate 92, bearing a transparent electrode 91, on top of the liquid crystal material 93. By means not shown in the present disclosure, but which are disclosed in the above-referenced Dill et al. patent, the transparent electrode 91 is spaced from the backplate at a predetermined distance.

What is claimed is:

1. A liquid crystal display panel for providing a pictorial display comprising in combination:
    (a) a semiconductor backplate having a major surface;
    (b) a doped layer extending along said surface, said layer having an array of openings arranged in a plurality of columns and rows;
    (c) a switching device formed in said semiconductor backplate surface entirely within each said opening;
    (d) a coplanar array of closely spaced, reflective back electrodes, each extending entirely over a respective one of said openings;
    (e) means for electrically connecting each of said switching devices to the back electrode extending over it;
    (f) a transparent front electrode spaced from said coplanar array of back electrodes;
    (g) liquid crystal material confined between said front and back electrodes; and
    (h) means for applying an actuating voltage between selected ones of said back electrodes and said front electrode through said switching devices.

2. The combination of claim 1 characterized further in that said means for connecting includes an intermediate electrode connected to said switching device and to said back electrode and extending parallel to said semiconductor backplate surface to form a capacitor with said doped layer.

3. The combination of claim 1 characterized further in that said semiconductor backplate is N-type silicon and said doped layer thereon is also N-type but much more heavily doped than the remainder of the said backplate.

4. The combination of claim 2 characterized further in that each of said switching devices is a MOSFET having a source, gate and a drain, and in that said means for applying an actuating voltage includes a plurality of equidistant parallel gate buses, each gate bus connected to the gates of a different row of said switching transistors and a plurality of equidistant parallel supply buses, each supply bus connected to the drains of a different column of switching transistors, with the source of each switching transistor being connected to its associated intermediate electrode.

5. The combination of claim 4 characterized further in that said supply and gate buses define a plurality of similarly shaped areas, respective ones of said openings being at corresponding corners of said areas, respective ones of said intermediate electrodes being located within the confines of corresponding ones of said areas, said back electrodes being laterally offset relative to said areas so as to extend entirely over said openings at the corners of said areas.

6. A liquid crystal display having: a semiconductor backplate with a major surface, an array of switching devices formed in said semiconductor backplate surface, a coplanar array of closely spaced reflective back electrodes, each electrode electrically connected to a different one of said switching devices, a transparent front electrode spaced from said coplanar array of back electrodes, liquid crystal material confined between said front and back electrodes, and means for applying an actuating voltage between selected ones of said back electrodes and said front electrodes through said switching devices and characterized by
    (a) a doped layer extending along said semiconductor surface, said layer having a plurality of gaps, all of said switching devices being located entirely in said gaps and surrounded by said doped layer; and
    (b) all of said gaps being entirely covered by said reflective back electrodes, whereby the effect of incident light on said display is minimized.

7. A liquid crystal display in accordance with claim 6 characterized further in that each of said gaps contains a different one of said switching devices.

8. A liquid crystal display panel in accordance with claim 7 characterized further in that each of said gaps is individually covered by a different one of said back electrodes.

* * * * *